(12) United States Patent
Signer et al.

(10) Patent No.: US 11,571,067 B1
(45) Date of Patent: Feb. 7, 2023

(54) KEYED RACK RAIL ENSURING PROPER DEVICE ORIENTATION

(71) Applicant: ZT Group Int'l, Inc., Secaucus, NJ (US)

(72) Inventors: Ryan Signer, Round Rock, TX (US); Kapil Rao Ganta Papa Rao Bala, Georgetown, TX (US); Rey Reyes, Hutto, TX (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/383,224

(22) Filed: Jul. 22, 2021

(51) Int. Cl.
*A47B 96/14* (2006.01)
*A47B 57/00* (2006.01)

(52) U.S. Cl.
CPC .......... *A47B 96/1408* (2013.01); *A47B 57/00* (2013.01)

(58) Field of Classification Search
CPC . A47B 96/1408; A47B 57/00; A47B 2210/09; A47B 88/0418; A47B 88/04; A47B 2210/0059; F16C 29/005; F16C 35/02; F16C 43/02; F16C 29/004; H05K 7/1489
See application file for complete search history.

(56) References Cited

U.S. PATENT DOCUMENTS

| | | | | |
|---|---|---|---|---|
| 6,854,605 B2 * | 2/2005 | Wrycraft | ............... | H05K 7/1491 211/187 |
| 7,604,307 B2 * | 10/2009 | Greenwald | ............ | A47B 88/49 312/334.46 |
| 2013/0106271 A1 * | 5/2013 | Anderson | ............ | A47B 88/941 312/334.9 |

* cited by examiner

Primary Examiner — Devin K Barnett
(74) Attorney, Agent, or Firm — Dergosits & Noah LLP; Todd A. Noah

(57) ABSTRACT

An apparatus is provided for ensuring the proper orientation of an electronic device within a rack slot. A constraint is added to one of a pair of rail assemblies and a corresponding constraint is added to the rack, the pair of constraints cooperating to allow the pair of rail assemblies to be installed only in the proper sides of the rack. Mounting holes are provided on the device and inner rails of the rail assemblies that allow the inner rail assemblies to be installed only on the proper sides of the device. A key and key slot combination is then provided in an inner rail and a middle rail of one rail assembly with the combination preventing the inner rail from being fully inserted into the incorrect middle rail. Thus, the correct orientation of the device is ensured by the pair of rail assemblies, the spacing of mounting holes in the device, and the rack constraint.

15 Claims, 7 Drawing Sheets

KEYED RACK RAIL ENSURING PROPER DEVICE ORIENTATION

BACKGROUND

For a device that plugs into a rack level power source (e.g., bus bars), it can be harmful to the device or even hazardous if the device is installed upside down. If a device is installed in an inverted position, the device power leads will engage the power source incorrectly, i.e., the ground plug will contact the live bus bar.

FIG. 1 is an isometric view of a prior art arrangement of a rack 10 and an electronic device 20. In FIG. 1, rack 10 includes posts 12a . . . 12d. Rail assemblies 30a, 30b include inner rails 32a, 32b, middle rails 34a, 34b, and outer rails 36a, 36b. Typically, inner rails 32a, 32b are affixed to device sides 22a, 22b using mounting keyholes 38a . . . 38d (FIG. 2, for device side 22a) and 39a . . . 39d (device side 22b).

FIG. 3 is an isometric view of prior art rail assemblies 30a, 30b, which include front mounting brackets 40a, 40b and rear mounting brackets 42a, 42b. FIG. 1 through FIG. 3 illustrate that inner rails 32a, 32b may be interchangeably installed on either side 22a, 22b of electronic device 20. Similarly, rail assemblies 30a, 30b may be interchangeably installed on either side (posts 12a/12b or posts 12c/12d) of rack 10. Thus, after inner rails 32a, 32b are attached to electronic device 20, the device may be improperly inverted when installed (direction 150 (FIG. 7)) in rack 10 by installing the inner rails into the opposite middle rail (i.e., inner rail 32a into middle rail 34b), or by installing the entire rail assemblies onto the wrong posts (assembly 30a onto posts 12c/12d). In other words, with the apparatus of FIG. 1-FIG. 3, device 20 may be inverted when installed, causing electrical connectors 44 (FIG. 4) to connect to the opposite polarity (i.e., connecting power directly to ground).

It is not always possible or desirable to change the device chassis or rack to prevent installing the device inverted. For example, subsequent changes to a device chassis may make initial custom rack adaptations obsolete.

Thus, what is needed is an apparatus that ensures proper device orientation within a rack system that accommodates device chassis modifications and entirely different device chassis.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a keyed rack rail assembly ensuring proper device orientation. Embodiments prevent the incorrect, inverted installation of a chassis by integrating a keying mechanism into the telescoping rails and including a rack constraint, such as an L-bracket, and an outer rail constraint, such as a T-pin, that ensure installing the keyed rack rail on the proper rack side. In an embodiment, a left inner member of a rail is made compatible only with the left middle rail member using, e.g., a key and slot combination. Optionally, the right inner rail member may also be made compatible only with the right middle member. The physical constraints that is added to the rack and rail ensure that the left rail is installed on the left side of the rack and the right rail be installed on the right side of the rack. In an embodiment, the rack constraint is installed between rack posts, i.e., in the zero U space, which does not impact the dimensions or shape of the device chassis. Thus, in embodiments, the keyed rail and constraints do not have to change with different chassis versions.

Figure 1:
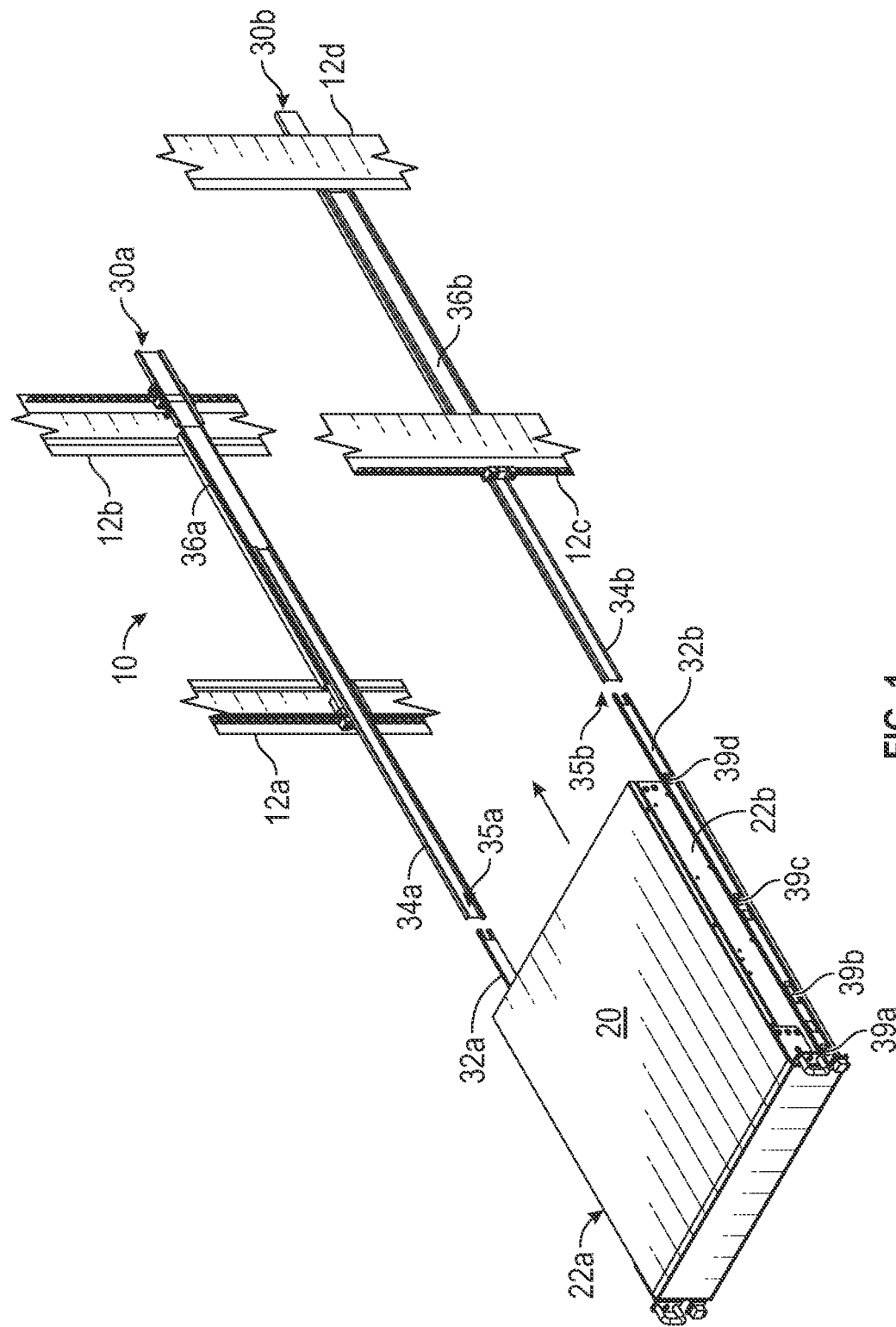
FIG. 1 is an isometric view of a prior art arrangement of a rack and an electronic device.
Figure 2:
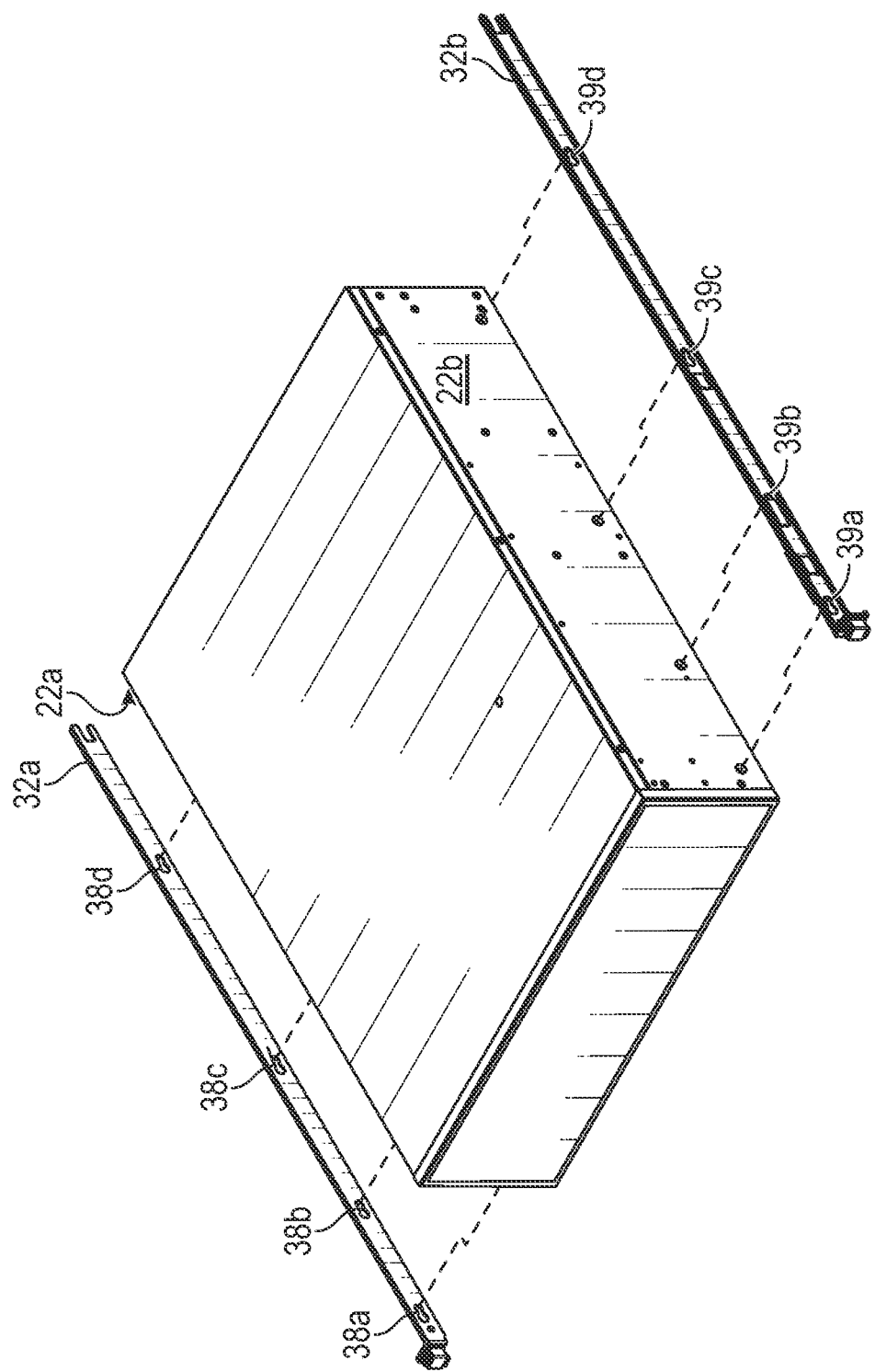
FIG. 2 is an isometric view of a prior art arrangement of an electronic device and elements of rails.
Figure 3:
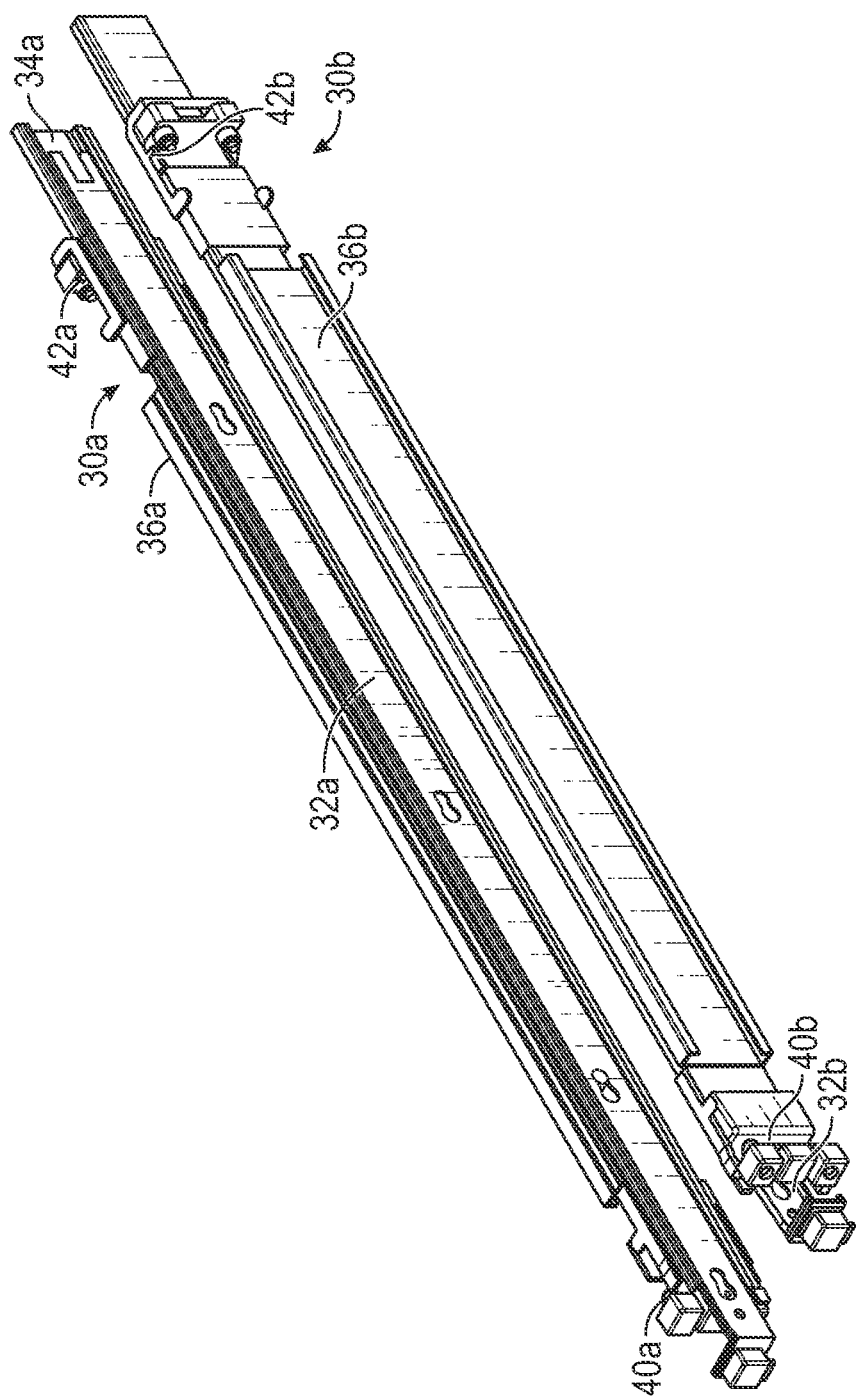
FIG. 3 is an isometric view of prior art rail assemblies.
Figure 4A:
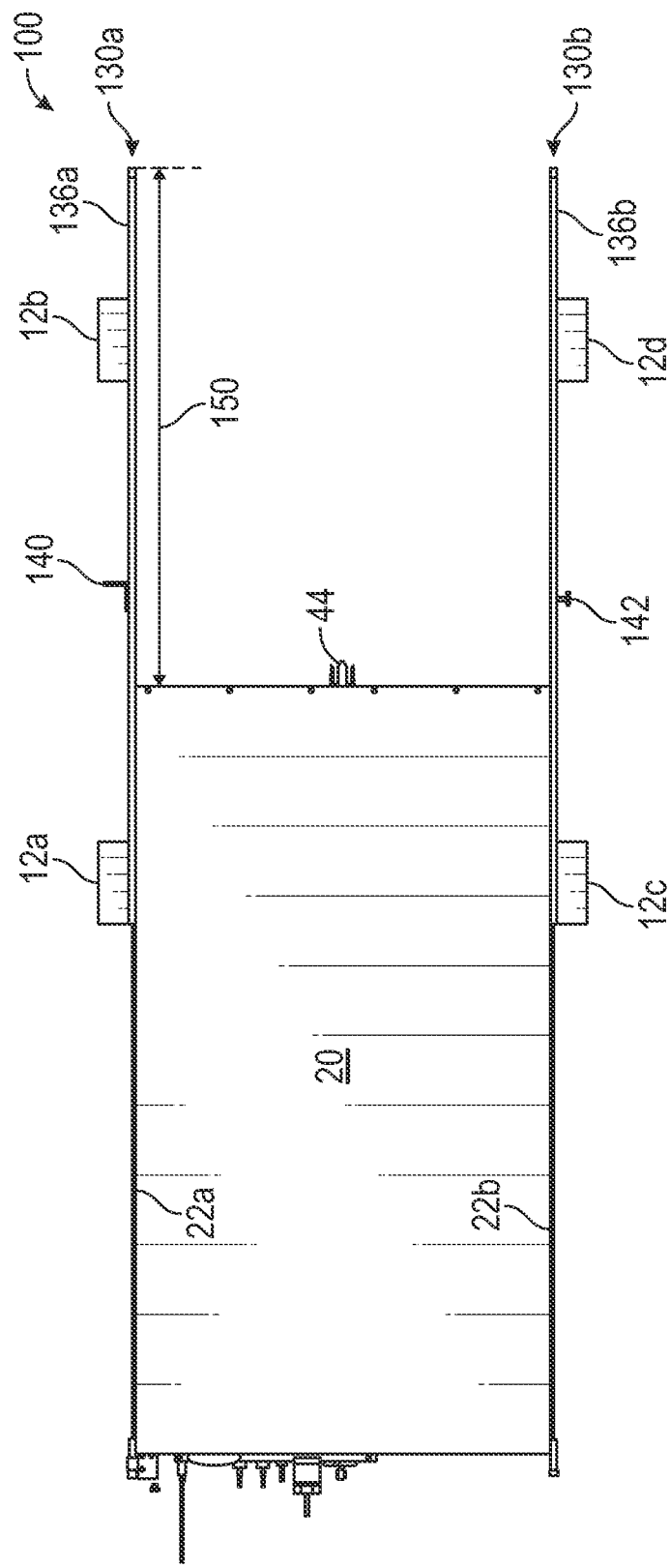
FIG. 4A is a top view illustrating elements of an embodiment of a keyed rack rail assembly.

FIG. 4A is a top view illustrating elements of an embodiment of a keyed rack rail assembly 100. In FIG. 4A, rack rail assembly 100 includes rail assemblies 130a, 130b and a rack constraint 140. Rail assemblies 130a, 130b include outer rails 136a, 136b, middle rails 134a, 134b (FIG. 6B), and inner rails 132a, 132b (FIG. 6A), respectively. Rack constraint 140 is, in the embodiment, shown as an L-bracket attached to rack 10 between posts 12a, 12b and running in the same direction as posts 12a, 12b. Thus, rack constraint 140 is found in the same place in each device slot within rack 10. Rail assembly 130b is shown to include a rail constraint 142, shown as a T-pin in this embodiment. Rail constraint 142 is disposed on an outer rail 136b of rail assembly 130b such that when assembly 130b is installed in rack 10, rail constraint 142 opposes rack constraint 140 across the device slot. Thus, rail constraint 142 and rack constraint 140 cooperate to prevent the installation of rail assembly 130b onto posts 12a, 12b because, if such assembly were attempted, rail constraint 142 would interfere with rack constraint 140. The interference would both indicate the incorrect position of rail 136b and prevent the incorrect assembly of rail 136b onto posts 12a, 12b.

In FIG. 4A, rack constraint 140 is shown as an L-bracket and rail constraint 142 is shown as a T-pin, however, in embodiments, rack constraint 140 and rail constraint 142 may be give other, arbitrary shapes, so long as the shape given to the rail constraint interferes with the shape given to the rack constraint if it is attempted to install the rail with constraint on the improper side of the rack. Thus, the rack constraint may be, e.g., an elongate bracket, a pipe, or other element, and the rail constraint may be, e.g., a pin, a ridge, or other mass. Similarly, the position of rack constraint 140 and rail constraint 142 may be moved relative to rails 130a, 130b so long as the rail constraint in the given position on rail 136b interferes with the rack constraint in the given position in rack 10 if it is attempted to install the rail with constraint on the improper side of the rack.

Figure 4B:
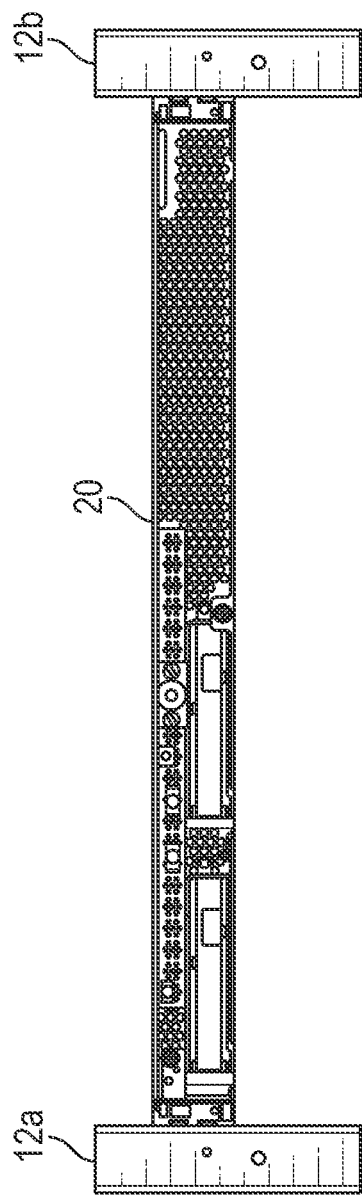
FIG. 4B is a front view illustrating a use case for an embodiment of a keyed rack rail assembly.

FIG. 4B is a front view illustrating a use case for an embodiment of keyed rack rail assembly 100. In FIG. 4b, device 20 is a server installed in slot 6 of a server rack. Because of keyed rack rail assembly 100, device 20 cannot be installed upside down.

Figure 5C:
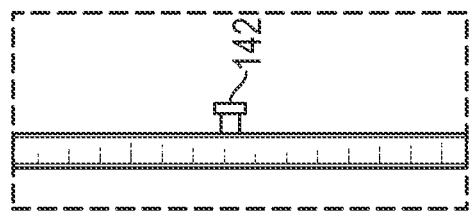
FIG. 5C is a top view further illustrating details of elements of FIG. 5A.
Figure 5B:
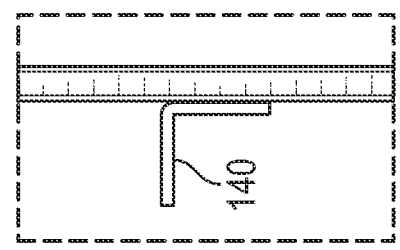
FIG. 5B is a top view further illustrating details of elements of FIG. 5A.
Figure 5A:
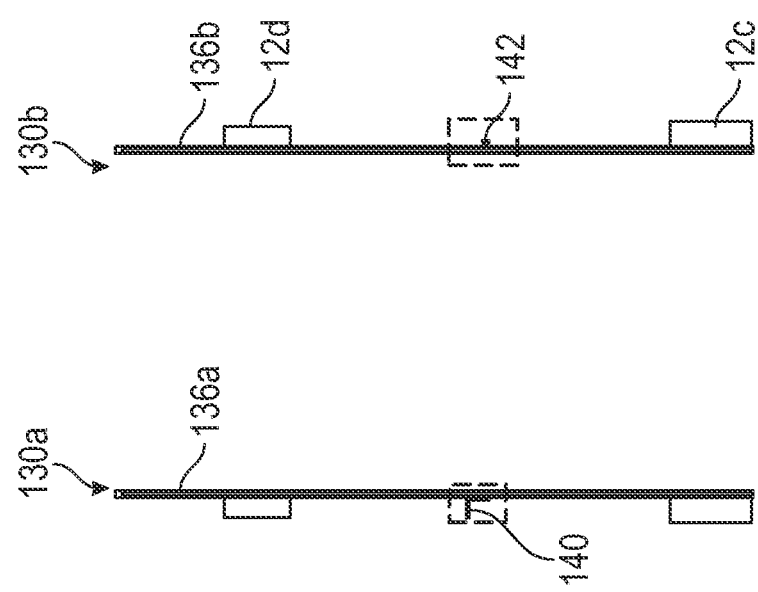
FIG. 5A is a top view illustrating elements of an embodiment of a keyed rack rail assembly.

FIG. 5A-FIG. 5C are top views further illustrating elements of an embodiment of keyed rack rail assembly 100. In FIG. 5A, rail assembly 130a, installed on rack posts 12a, 12b, is shown enlarged in FIG. 5B. FIG. 5B illustrates the position of rack constraint 140 with regard to outer rail 136a. In FIG. 5A, rail assembly 130b, installed on rack posts 12c, 12d, is shown enlarged in FIG. 5C. FIG. 5C illustrates the position of rail constraint 142 with regard to outer rail 136b. FIG. 5A-FIG. 5C illustrate that, with rail constraint 142 at the same depth within rack 10 as rack constraint 140, rail assembly 130b may not be installed on posts 12a, 12b without interfering with rack constraint 140. Thus, embodiments of rail assembly 100 ensure the proper orientation of rails 130a, 130b on rack 10.

Figure 6A:
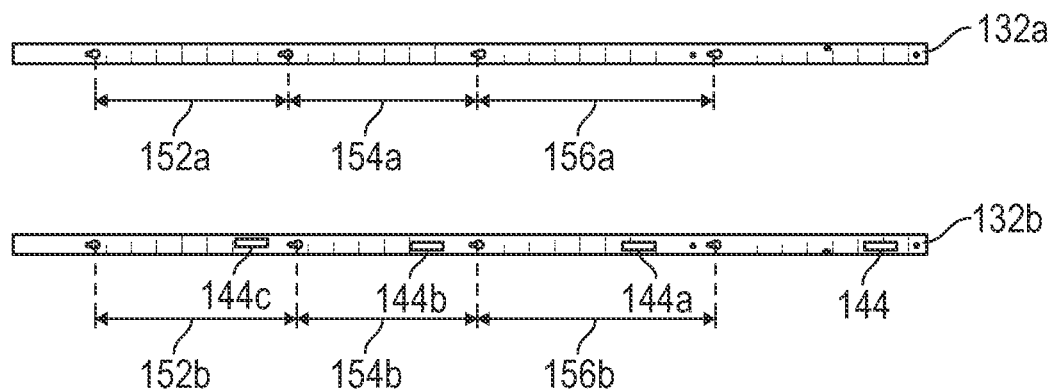
FIG. 6A is a side view illustrating elements of an embodiment of a keyed rack rail assembly.

FIG. 6A is a side view illustrating elements of an embodiment of keyed rack rail assembly 100. In FIG. 6A, inner rails 132a, 132b are shown to have different spacing between mounting keyholes 138a . . . 138d of rail 132a and keyholes 139a . . . 139d of rail 132b. Rail 132 includes spacings 152a, 154a, 156a and rail 132b includes spacings 152b, 154b, 156b. Mounting holes with spacings 154a, 154a, 156a are provided on the left side of device 20 and mounting holes with spacings 154b, 154b, 156b are provided on the right side of device 20 on the appropriate side. In the embodiment, the different spacing ensures that left inner rail 132a is installed on the left side of device 20 and right inner rail 132b is installed on the right side of device 20. In the embodiment, only one of spacings 152a . . . 156a needs to be different from one of spacings 152b . . . 156b to ensure rail 132a cannot be installed in place of rail 132b and vice versa.

Figure 6B:
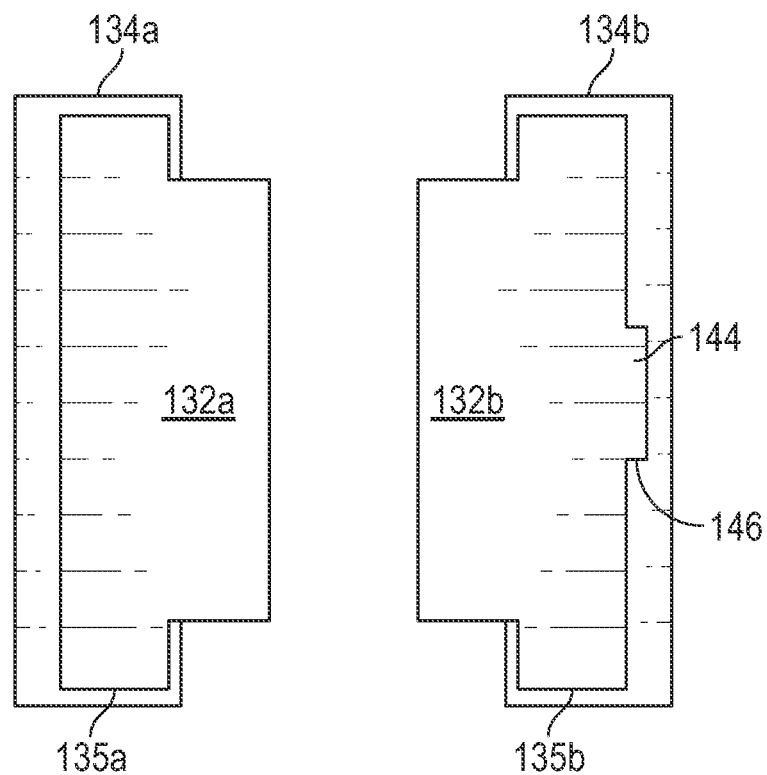
FIG. 6B is an end view further illustrating details of elements of FIG. 6A.

FIG. 6A and FIG. 6B illustrate a key 144 or raised section provided on the side of inner rail 132b that faces middle rail 134b. Key 144, extending from inner rail 132b, is admitted into and slides within a key slot 146 provided in a middle rail channel 135b in middle rail 134b. Inner rail 132a slides within a middle rail channel 135a within middle rail 134a. Since middle rail 134a does not include key slot 146, inner rail 132b may not be fully inserted into middle rail 134a because key 144 interferes with middle rail channel 135a. Thus, embodiments in which inner and middle rails include a cooperating pair of key and corresponding key slot ensure that the desired inner rail is inserted into the desired middle rail. In an embodiment, the relative positions of key and key slot may be reversed from that shown in FIG. 6B, i.e., key 144 may be incorporated into slot 135b of middle rail 134b and key slot 146 may be incorporated into inner rail 132b. In an embodiment, the relative shapes of key 144 and slot 146 may be arbitrarily adjusted so long as key 144 is admitted by slot 146 and key 144 interferes with the insertion of the inner rail in the opposing middle rail. For example, key 144 may be shaped with a point and slot 146 may be a square slot as shown or a v-shaped groove corresponding to the point. Similarly, FIG. 6A illustrates that key 144 may be disposed at positions 144a . . . 144c and still prevent the full insertion of inner rail 132b into middle rail 134b. With key 144 in any of optional positions 144a . . . 144c, device 20 would be prevented from being fully seated in the rack slot and contacting the rear power bus bar.

In embodiments, middle rails are typically not separable from outer rails. Thus, keying features do not usually need to be incorporated between middle rail 134b and outer rail 136b to ensure proper device orientation. However, in an embodiment, a key/slot combination similar to key 144/slot 146 may be provided to middle rail 134b and outer rail 136b to ensure proper rail assembly.

Figure 7:
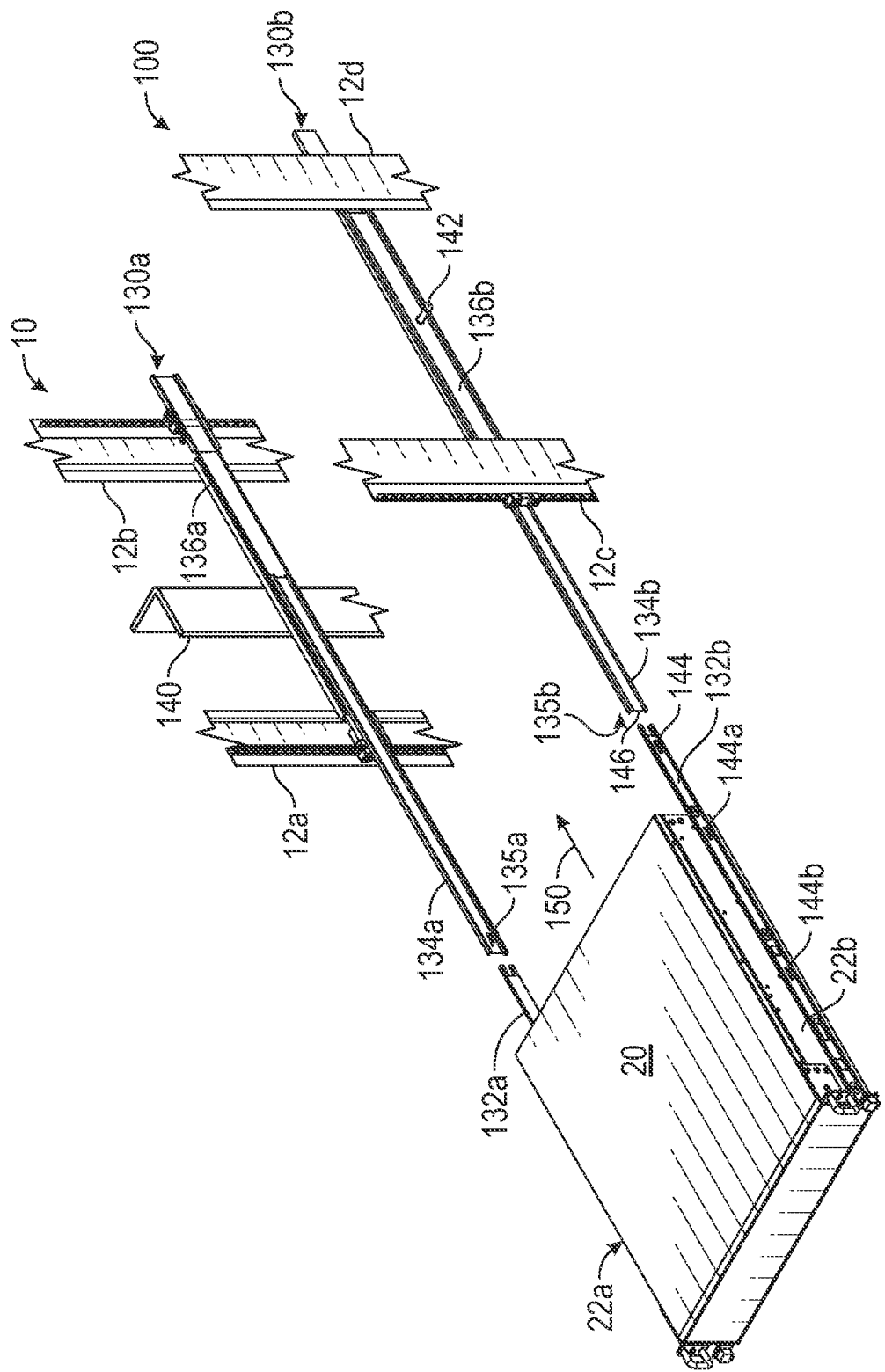
FIG. 7 is an isometric view illustrating an embodiment of a keyed rack rail assembly.

FIG. 7 is an isometric view illustrating an embodiment of keyed rack rail assembly 100. In FIG. 7, rail assembly 130b is shown installed on posts 12c, 12d of rack 10. Rail assembly 130b cannot be installed on posts 12a, 12b because rail constraint 142 would interfere with rack constraint 140. Inner rail 132b is installed on side 22b of device 22. Inner rail 132b cannot be installed on the opposing side 22a of device 20 because keyhole spacings 152b . . . 156b do not all have corresponding holes on side 22a. With inner rails 132a, 132b properly mounted to device 20, inner rail 132a, with key 144, may be received fully in direction 150 into rail channel 135b, within slot 146. This allows device 20 to be inserted fully into the slot of rack 10. After inner rail 132b is mounted to side 22b, if device 20 were inverted and the installation into rack 10 attempted, key 144 would interfere with an edge of middle rail channel 135a, preventing device 20 from being fully inserted into the slot. In this manner, embodiments of keyed rack rail assembly 100 ensure the proper orientation of device 20 within rack 10.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   a rack;
   a first rail assembly configured to be installed on a first side of the rack and including a first inner rail and a first outer rail, the first inner rail separably inserted within the first outer rail;
   a second rail assembly configured to be installed on an opposing second side of the rack and including a second inner rail, a second outer rail, and a mass disposed on the second outer rail, the second inner rail separably inserted within the second outer rail;

an elongate element disposed on the first side of the rack, and the first rail assembly or the second rail assembly includes a track including a raised section slidable within a slot, wherein:

when the first rail assembly and the second rail assembly are in use on the rack, the raised section sliding within the slot permits the first inner rail to move with respect to the first outer rail, or permits the second inner rail to move with respect to the second outer rail;

when an attempt is made to install the second rail assembly on the first side of the rack the mass disposed on the second outer rail interferes with the elongate element and prevents the installation; and when the first inner rail and the second inner rail are separated from the first outer rail and the second outer rail, the raised section prevents the first inner rail from being fully inserted into the second rail assembly or prevents the second inner rail from being fully inserted into the first rail assembly.

2. The apparatus of claim 1, wherein:

the second rail assembly is configured such that the second rail assembly may be installed on the first side of the rack but for the mass.

3. The apparatus of claim 1 further comprising:

a first middle rail in the first rail assembly; and a second middle rail in the second rail assembly, wherein:

the track is positioned between the first middle rail and the first inner rail or between the second middle rail and the second inner rail.

4. The apparatus of claim 3, wherein:

the slot is included in the middle rail of the rail assembly associated with the track, and the raised section is included in the inner rail of the rail assembly associated with the track.

5. The apparatus of claim 1, wherein, when installed on the rack, the elongate element and the first and second rail assemblies are installed on the rack such that the elongate element is oriented perpendicularly with respect to a plane defined by a slot position in the rack and the first and second rail assemblies are along opposing sides of the slot position.

6. The apparatus of claim 1, wherein the mass includes: a pin, a cylinder, a ridge, or a bump.

7. The apparatus of claim 1, wherein:

the mass includes a T-pin, the elongate element includes an L-bracket, and the raised section includes a key.

8. A kit comprising:

a first rail assembly configured to be installed on a first side of a rack and including a first inner rail and a first outer rail;

a second rail assembly configured to be installed on a second side of the rack and including a second inner rail, a second outer rail, and a mass disposed on the second outer rail, the second inner rail separably inserted within the second outer rail;

an elongate element configured to be installed on the first side of the rack, and the first rail assembly or the second rail assembly includes a track including a raised section slidable within a slot, wherein:

when the first rail assembly and the second rail assembly are in use on the rack, the raised section sliding within the slot permits the first inner rail to move with respect to the first outer rail, or permits the second inner rail to move with respect to the second outer rail;

when the elongate element is installed on the first side of the rack and an attempt is made to install the second rail assembly on the first side of the rack, the mass disposed on the second outer rail prevents installing the second rail assembly on the first side of the rack due to an interference between the mass and the elongate element; and when the first inner rail and the second inner rail are separated from the first outer rail and the second outer rail, the raised section prevents the first inner rail from being fully inserted into the second rail assembly or prevents the second inner rail from being fully inserted into the first rail assembly.

9. The kit of claim 8, wherein:

the second rail assembly is configured such that the second rail assembly may be installed on the first side of the rack but for the mass.

10. The kit of claim 8 further comprising:

a first middle rail in the first rail assembly; and a second middle rail in the second rail assembly, wherein:

the track is positioned between the first middle rail and the first inner rail or between the second middle rail and the second inner rail.

11. The kit of claim 10, wherein:

the slot is included in the middle rail of the rail assembly associated with the track, and the raised section is included in the inner rail of the rail assembly associated with the track.

12. The kit of claim 10, wherein:

the raised section is included in the middle rail of the rail assembly associated with the track, and the slot is included in the inner rail of the rail assembly associated with the track.

13. The kit of claim 8, wherein the elongate element and the first and second rail assemblies are configured to be installed on the rack such that the elongate element is oriented perpendicularly with respect to a plane defined by a slot position in the rack and the first and second rail assemblies are along opposing sides of the slot position.

14. The kit of claim 8, wherein the mass includes: a pin, a cylinder, a ridge, or a bump.

15. The kit of claim 8, wherein:

the mass includes a T-pin, the elongate element includes an L-bracket, and the raised section includes a key.

\* \* \* \* \*